US006958754B2

(12) United States Patent  (10) Patent No.: US 6,958,754 B2
Alexander et al.  (45) Date of Patent: Oct. 25, 2005

(54) BOOKMARKS FOR A DIGITAL OSCILLOGRAPHIC INSTRUMENT

(75) Inventors: Jay A Alexander, Monument, CO (US); Danny J Oldfield, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 412 days.

(21) Appl. No.: 10/388,352

(22) Filed: Mar. 13, 2003

(65) Prior Publication Data

US 2003/0169257 A1      Sep. 11, 2003

Related U.S. Application Data

(63) Continuation of application No. 09/429,506, filed on Oct. 28, 1999, now abandoned.

(51) Int. Cl.[7] .............................................. G06T 11/00
(52) U.S. Cl. .................................. 345/440; 345/440.1
(58) Field of Search ............................. 345/440, 440.1

(56) References Cited

U.S. PATENT DOCUMENTS

| 5,566,092 A | * | 10/1996 | Wang et al. ................. 702/185 |
| 5,605,158 A | * | 2/1997 | Snell ........................... 600/508 |
| 5,684,508 A | * | 11/1997 | Brilman .................... 345/440.1 |
| 6,020,898 A | * | 2/2000 | Saito et al. .................. 345/440 |
| 6,473,084 B1 | * | 10/2002 | Phillips et al. .............. 345/440 |
| 6,529,842 B1 | * | 3/2003 | Williams et al. ............. 702/66 |

* cited by examiner

*Primary Examiner*—Almis R. Jankus
(74) *Attorney, Agent, or Firm*—Edward L. Miller

(57) ABSTRACT

A digital oscilloscope assists in the process of identifying, cataloging and restoring views of interest within a stored trace acquisition by implementing the notion of bookmarks. In response to a command to establish a bookmark, the scope takes note of selected display control parameters, such as the location of the view in the overall acquired trace and horizontal time per division, and stores that as a named bookmark. The scope accepts from the operator a comment associated with each bookmark. Another command lists defined bookmarks and causes the scope to re-institute the view and parameters associated with a specified bookmark. There is a mechanism for editing the descriptors or parameters that are defined by a bookmark.

22 Claims, 14 Drawing Sheets

BOOKMARKS FOR A DIGITAL OSCILLOGRAPHIC INSTRUMENT

REFERENCE TO RELATED APPLICATION

This is a continuation of an Application, now abandoned, of the same title, Ser. No. 09/429,506 filed on 28 Oct. 1999.

REFERENCE TO ISSUED PATENT

The subject matter disclosed in U.S. Pat. No. 5,939,877 is of interest to the invention described herein, in that it serves as an example of one possible digital oscillographic environment within which the invention may be practiced. In the interest of brevity U.S. Pat. No. 5,939,877 is hereby incorporated herein by reference. It will be understood that the incorporated material is merely exemplary, and is by no means the only environment within which the invention can be practiced.

BACKGROUND OF THE INVENTION

Digital oscilloscopes are powerful tools for analyzing waveforms. By digitizing one or more analog signals and storing the resulting digital values in memory the operator of the digital oscilloscope can leisurely peruse a persistent waveform display created from those stored values to investigate relationships of interest. Unlike an analog scope that cannot begin to write its display until it is triggered, its digital counterpart can retain data acquired prior to being triggered, and can thus display events both before and after the trigger event. Since any collection of memory is finite, the memory is generally organized to store the most recent samples at the expense of overwriting the oldest samples, and the operator specifies ahead of time what portion of the memory is to be used for data acquired subsequent to the trigger event, such that the events of interest are likely to be recorded in memory. The memory can be quite large, and might contain perhaps a thousand times more data than can be conveniently displayed. This leads to the notion of the displayed view as a scalable and positionable subset of the total data set. Panning is the name given to the operation of positioning the displayed subset, and zooming refers to the scale used to create that displayed view. So, for example, if there are two milliseconds of data in the memory, sampled at one nanosecond intervals, then there are two million samples for each channel that has been sampled. At even a moderately fast display scaling of, for example, 10 us/div, the ten divisions of the oscilloscope display will thus show only five percent of the acquired data. Panning and zooming must therefore be performed to identify meaningful views within the acquisition.

It often happens that it is desirable to visit and re-visit the different meaningful views several times, often in an arbitrary order, as questions arise and discussion ensues. And although there are various annunciators that indicate where in overall acquisition the present view is located, and what its horizontal and vertical scale are, with conventional equipment it is often inconvenient to alternately visit the different views of interest. Much manipulation of the controls is required, and there is the possibility of operator error. In addition, data is often stored off-line in a file and revisited over long periods of time. This necessitates the manual recording of position and scale parameters for those views that are of interest, lest they be forgotten and need to be discovered all over again. Such manually kept records can be misplaced or confused with other records, and are generally inconvenient. It would be desirable if the oscilloscope itself could assist in the process of identifying, cataloging and restoring views of interest within a stored trace acquisition.

SUMMARY OF THE INVENTION

The oscilloscope itself can assist in the process of identifying, cataloging and restoring views of interest by means of an abstraction that we shall call a "bookmark". In response to a command or instruction to establish a bookmark, the scope takes note of selected display control parameters, such as the location of the view in the overall trace, horizontal time per division, vertical sensitivity, and perhaps certain other features, such as the existence of a measurement mode and the locations of any measurement cursors. The "location of the view" within the overall acquired trace is referred to in different ways by different manufacturers. In one scheme there is a distinguishable reference pointer visible in the view and that is set to be before or after the trigger event by a selectable amount of time (the "delay"), and that can be variously positioned within the view. Panning is then accomplished by adjusting the delay. Whatever scheme is in use, notice is taken of the requisite parameters, and those are associated with a name that refers to that bookmark. The name may be predetermined, or the scope might either prompt for or accept from the operator a descriptive label for this view (a bookmark name). Predetermined bookmark names might be "#1", "#2", . . . or "1", "2", . . . or "A", "B", . . . . Operator supplied bookmark names might be "P/S GLITCH", or "START OF INIT", etc. Another instruction or command causes the scope to re-institute the view and parameters associated with a specified bookmark. Preferably, yet another instruction or command lists the bookmarks that have been defined, and allows one thereof to be selected as the active view. It is also desirable that there be a mechanism for editing the descriptors or parameters that are defined by a bookmark, and also for there to be a comment field associated with each bookmark. Finally, it would also be desirable for system operations that save captured data and print the view on the screen to be augmented to store and print the bookmark information, so that the notion of bookmarks is fully integrated into the rest of the operation of the digital oscillographic instrument.

DESCRIPTION OF A PREFERRED EMBODIMENT

Figure 1:
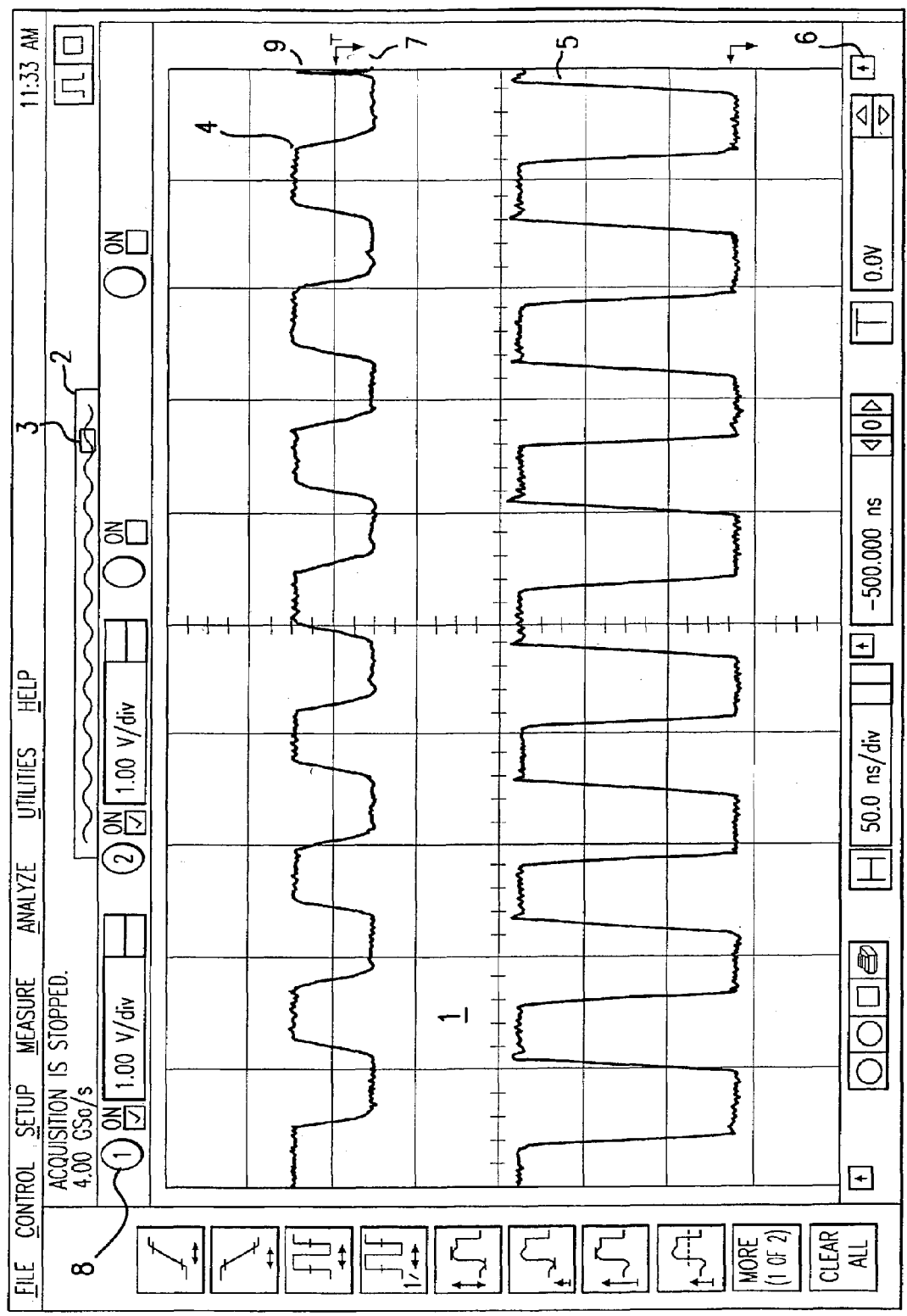
FIG. 1 is an oscillographic view of a circumstance useful in illustrating certain aspects of the notion of bookmarks as applied to a digital oscilloscope.

Refer now to FIG. 1, wherein is shown a view of a "computer crash" debugging problem produced by a conventional digital oscilloscope, such as a member of the BP 54800 series. Both the view and the scope that produced it will merely serve as points of departure for disclosing the invention. We shall indeed describe the figure, but wish first to point out that the scope that produced the view is described in a general way by the incorporated Alexander patent at lines 65 of col. 5 through line 34 of col. 8, all in reference to FIG. 1 of that patent. If one were to read that material he would discover that the scope described therein is indeed a bench top unit, although it incorporates a microprocessor, floppy disc drive, monitor, keyboard and a pointing device (e.g., a mouse or joy stick) in the same cabinet as the dedicated electronics needed for the digital oscilloscope "front end". That electronics includes the functions of input conditioning (impedance conversion, amplification, attenuation, etc.), a time base, signal acquisition (digitizing) and triggering. These items are under the general control of an oscillographic instrument program executed by the microprocessor under the supervision of an operating system, which may be a stock version of a commercially available O/S, such as one of the various Windows products available from the Microsoft Corp., or perhaps one of the Unix variants from other vendors. The particular example we shall use is of the Microsoft variety, which is what is used in the HP 54800 series scopes (it was originally Windows 95 but is presently Windows 98). So, it will be understood that the view produced by the scope appears in a window provided through the facilities of the operating system, with the various labels for dialog boxes, drop down menu contents and actual window content (waveform data) provided by the oscillographic instrument program. In short, the illustrative environment we are starting with is a computer of the PC (Personal Computer) style combined with a conventional digital oscilloscope front end. The PC executes the oscillographic instrument program under an instance of Windows 98 whose configuration is to automatically start the scope program at boot-up.

The bookmark feature as described here relies on graphical controls on the computer display as opposed to dedicated controls on the oscilloscope front panel. This is preferable, but not required. That is, while it would in principle be possible to have on the front panel a collection of dedicated physical controls for bookmarks, it is definitely preferable that those control functions be implemented with a graphical user interface of the sort found in computer systems. On the other hand, one should not assume that a commercial operating system is needed. There are other digital oscilloscopes on the market (e.g., the HP 54600 series) that have what amount to special purpose ("proprietary", or "dedicated") operating systems that serve their intended purposes quite well. Systems of that sort typically have system defined and context sensitive responses to certain input controls not permanently associated with any single function (e. g., a rotatable knob to select a cursor location and also to increment or decrement a selected value, such as a logic threshold) and system defined labels for a collection of soft keys. Such control paradigms could readily be extended to provide pleasing ease of use and extensive flexibility for a collection of useful and desirable bookmark features. It is such a collection, albeit illustrated in the Microsoft Windows 98 environment found in the HP 54800 series digital oscilloscopes, to which we now turn.

Refer again to FIG. 1 herein, which is a representation of a conventional view 1 obtained during the initial debugging of, say, a computer crash problem. The scope has sampled 32,768 points at a rate of $4 \times 10^9$ samples per second, thus capturing 8.192 usec displayed as waveforms 4 and 5. The horizontal scale is set to 50 nsec/div, so the view 1 in FIG. 1 represents 500 nsec, or approximately one sixteenth of the entire acquisition. The figurative sine wave shape in box 2 (called the "memory bar") represents the entire acquisition, and the highlighted portion in box 3 indicates which segment of the entire acquisition is presented as waveforms 4 and 5 in the view 1. A delay value of −500 nsec has been selected, which causes the location of the trigger in the final acquisition to be 500 nsec before the end of the acquisition (i.e., the scope continues to sample for another 500 nsec after the trigger). This explains why box 3 is not quite all the way to the right in memory bar 2. The trigger location has been selected to be at the right side of the view (as indicated by the highlighted or lit up arrow 6), which means that it is only data leading up to the trigger event that is displayed as part of the view 1. The scope was triggered from channel one (trace 4), as indicated by the "T" annunciator 7 in the margin at the right side of the channel one trace 4. (For the display of an actual scope there is no confusion about which trace is channel one, since the trace 4 for channel one and the channel one annunciator ("1") 8 would be rendered in the same color, which is a color different from the color used for channel two.)

The waveform event of interest is the narrow glitch 9 at the right side of trace 4. Let us simply stipulate that the scope has been triggered on the glitch 9. Having arrived at this acquisition, we wish now to investigate within the acquisition to see if we can determine the likely cause of the glitch.

Figure 2:
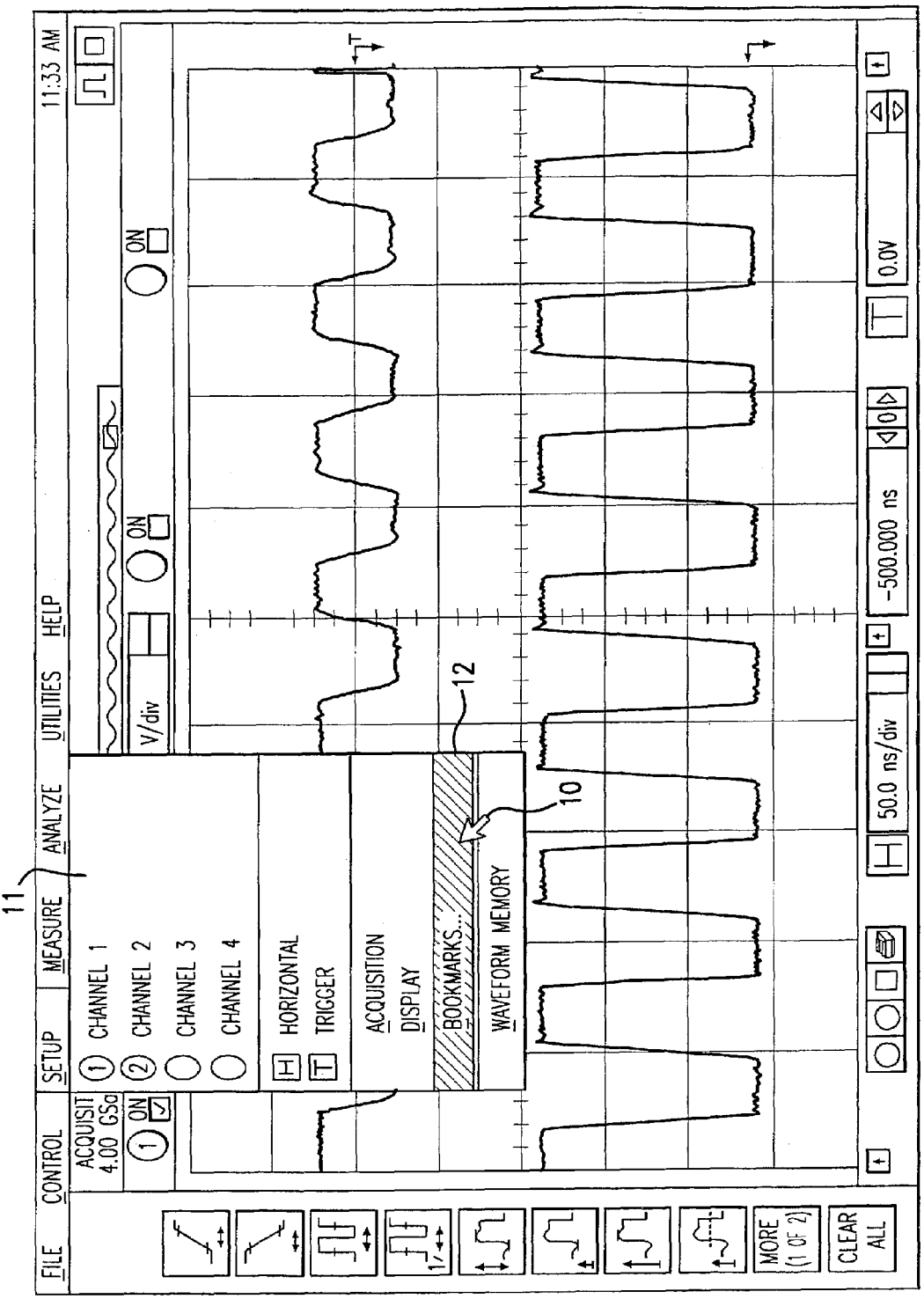
FIG. 2 illustrates the use of a drop down Setup menu to initiate a bookmark operation.

Refer now to FIG. 2, which is a sequel to the situation depicted in FIG. 1. In FIG. 2 a mouse positioned pointer 10 has been used to activate a drop down menu 11 and highlight therein a choice entitled "Bookmarks . . . " 12. This action involves the customary use of a button on the mouse (or track ball, or joystick, etc.). If indeed the operator intends to invoke the Bookmarks feature, he will release the button with the pointer 10 over the highlighted choice as shown, resulting in the situation depicted in FIG. 3.

Figure 3:
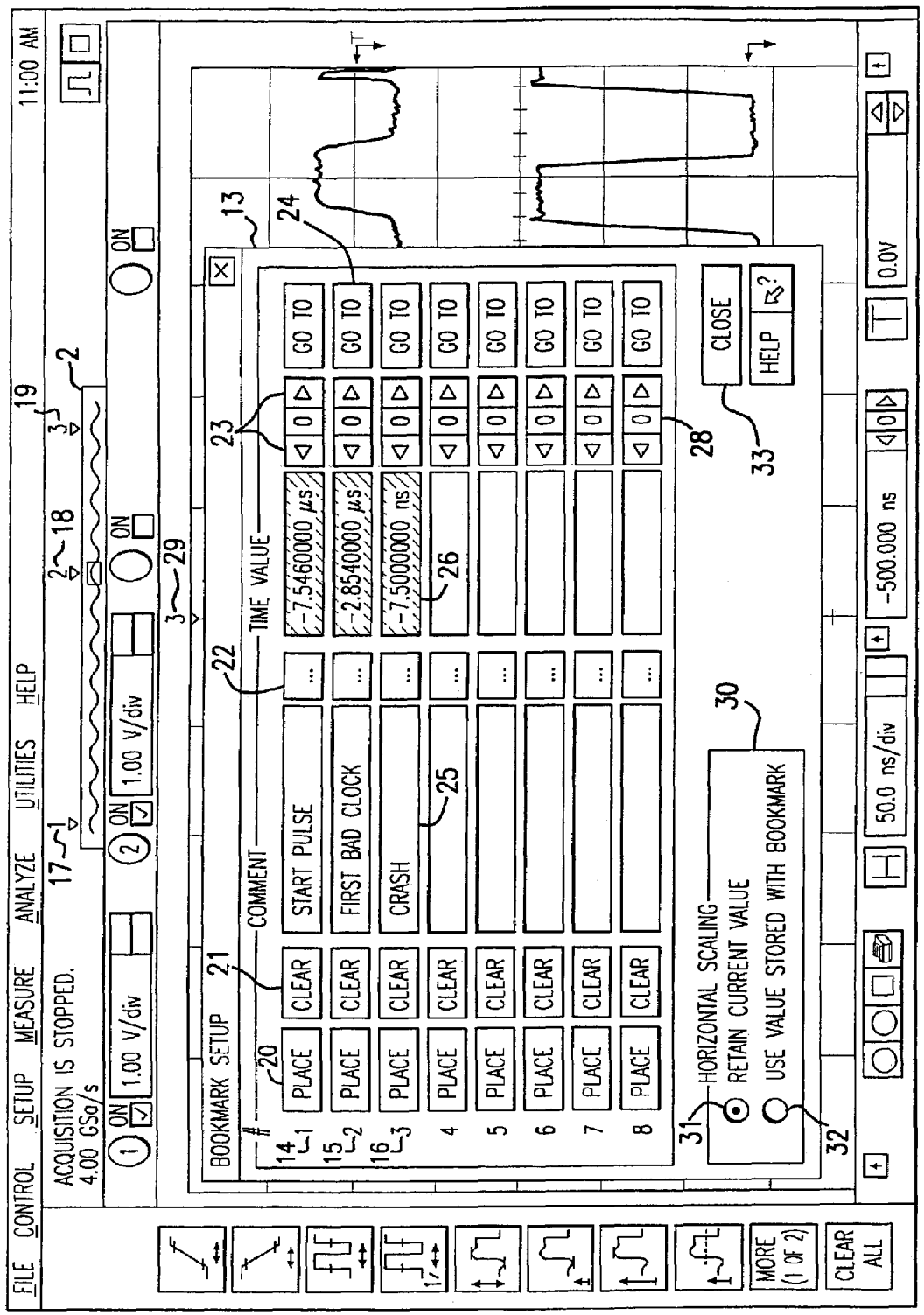
FIG. 3 illustrates a Bookmarks Setup dialog box invoked by the menu of FIG. 2.

FIG. 3 depicts a Bookmarks Setup window 13 of the sort that is displayed upon invoking the menu choice 12 of FIG. 2. The window 13 shown in FIG. 3 is after it has already undergone some interaction with the operator to define three bookmarks. Their names are "#1" (14), "#2" (15) and "#3" (16). As shown in the figure, these are fixed preassigned names out of a maximum possible of eight such named bookmarks. Such pre-definition at the factory level is but one of several possible ways in which this feature might operate. If needed, the window 13 might have a "slider" or "MORE" button to scroll or page its contents and reveal more bookmarks. It would seem that at some point a fixed number of bookmarks is almost certainly enough, although we must agree that there is absolutely no reason why window 13 could not have buttons or controls whose functions were to create a new blank bookmark and add it to the list, as well as delete indicated ones that are no longer wanted. Furthermore, there are no reasons, other than perhaps convenience and economy, why the names of bookmarks need to be fixed ahead of time. In our exemplary embodiment the names are fixed and short. This comports well with being able to use those names as annunciators 17, 18 and 19 over box 2 to indicate where in the overall acquisition the defined bookmarks are located. In our example these annunciators (17–19) are numbered wedges; other shapes and colors can be selected by the operator on a bookmark by bookmark basis. That their names are not of arbitrary length makes it less likely that they will overlay each other and cause confusion. Fixed short names are of less concern when it is appreciated that bookmarks may be commented with arbitrary text strings entered by the user.

In any event, the window 13 is shown after three bookmarks (#1, #2 and #3) have been defined. They are defined by performing various "mouse clicks" (pressing a button on the mouse) while the mouse pointer is over corresponding buttons of interest in window 13. For example, clicking on the PLACE button 20 for bookmark #1 causes the book mark named #1 to be defined as existing at the center of the current view for the displayed traces 4 and 5. This is a convenient way to establish a bookmark subsequent to having perused the data by having panned the view to be at that location. One the other hand, the operator can simply enter a value for the location into a Time Value field 26 using an actual keyboard or the virtual keyboard shown in FIG. 4. There is also a zero ("0") button 28 associated with each bookmark that will cause its Time Value field to be 0.0 (which will be the trigger location minus any delay value). Once there is a definite value in the Time Value field, increment and decrement buttons 23 can be used to modify the number shown in the Time Value field. As the number in the Time value field is modified the view will change to reflect that value, the better to assist in specifying a value that is of interest.

In the event the dialog box for bookmarks obscures the user's view of the waveform display, the user may elect to display the dialog box transparently or translucently, as described in U.S. Pat. No. 5,891,131, issued on 20 Apr. 1999.

Figure 4:
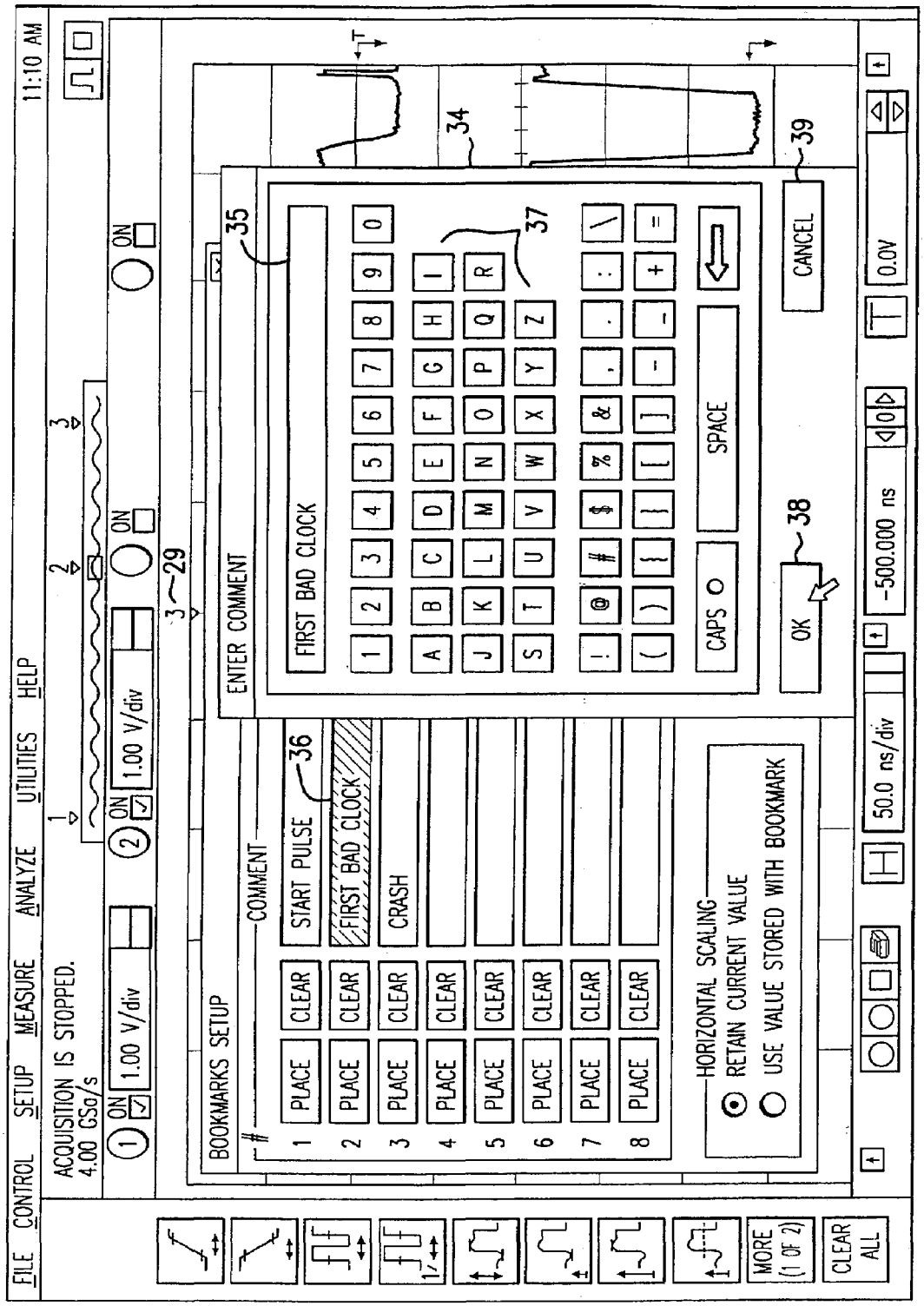
FIG. 4 illustrates a virtual keyboard that can be used with a mouse to enter numerical and text parameters associated with a bookmark.

Using either an actual keyboard or the virtual keyboard of FIG. 4, a text comment can be entered for each bookmark. This, of course, is an aid in recalling the meaning or significance of a bookmark. In our implementation, clicking over a " . . . " button 22 associated with a bookmark activates text entry into the associated Comment field 25. Comment field 25 need not be of fixed length, and could, for example, be an aperture that slides along a text string that is longer than the aperture.

Bookmarks that fall within the current view are also indicated by including a copy of their annunciator within the view; note the presence above the traces of wedge number three (29) in FIGS. 3–7.

Clicking over a Clear button 21 associated with a defined bookmark will set that bookmark to blank, or undefined. No annunciator is displayed for a bookmark that has been cleared. Furthermore, in our implementation a bookmark must first be defined before certain operations can be performed thereon. So, for example, in the presentations by the actual instrument the labels on buttons for all but the Place (20), "0" (28) and arrow (23) buttons are "grayed out" for cleared or undefined bookmarks. In the figures this is indicated by a lighter weight line for the lettering of those buttons.

The Bookmarks Setup dialog 13 of FIG. 3 also includes a box 30 bearing the legend Horizontal Scaling. Inside the box 30 are two push-buttons, one labeled "retain current value" (31) and the other "Use value stored with bookmark" (32); these settings are mutually exclusive in that only one of them may be selected at a time. The idea here is that the bookmark is, at root, a location in the acquisition, and that location is invariant with respect to the time scale used to view it. Nevertheless, when the bookmark was defined, there was on the screen a particular view, implying the use at the time of a particular horizontal time per division. That particular time per division is noted and stored as part of the information associated with that bookmark. Now, at some later time when that particular bookmark is invoked, the time per division in use might be different. In some circumstances it might make more sense to leave the current time per division unaltered when moving the view to the location associated with the bookmark. That is the meaning of the "Retain current value" push-button 31. In other circumstances the user may wish to force the use of the same horizontal time per division that existed when the bookmark was defined. That case calls for use of the "Use value stored with bookmark" push-button 32. The state of these push-buttons 31 and 32 in box 30 applies globally to all bookmarks, rather than being separately included in each individual bookmark definition. This affords the user flexibility in using bookmarks after they have been defined.

To continue with FIG. 3, clicking over a Go To button 24 associated with a bookmark will cause the displayed view to be the one described by that bookmark. That is, it accomplishes an automatic pan to the location identified by that bookmark's definition. The view will be constructed such that the location of interest will appear at the horizontal center of the view. Upon constructing the view, the dialog box 13 might be implemented to remain visible, to become transparent, or to construe the completed "Go To" as an implied "Close", as desired. In any event, there is a "Close" button 33 than can be used to terminate interaction with the Bookmarks Setup dialog 13.

Refer now to FIG. 4, wherein is shown an Enter Comment menu 34 that appears for the purpose of allowing mouse clicks over labeled key buttons therein (a virtual keyboard 37), so as to create a comment. Menu 34 appears in response to clicking over a " . . . " button 22 in the Bookmarks Setup menu 13. If desired, the system may accept keystrokes on an actual keyboard (if one is present) in place of ones on the virtual keyboard. In any event, once the desired text is visible in field 35, clicking on the "OK" button 38 will accept the comment and place it into the Comment field 36 associated with the bookmark being defined or modified. That will also close the entire Enter Comment window 34. Note also that the field 36 associated with that bookmark is highlighted. A "Cancel" button 39 will, if clicked on, abort the comment creation process and close the Enter Comment window 34.

The bookmark definition process described above is well suited to creating bookmarks, and as an adjunct allows invoking different bookmarks once they are defined. However, for this latter function, which might be heavily used during an investigation, the Bookmarks Setup dialog 13 is not a compact method of visiting the views associated with different bookmarks. We now explain a simpler method of such visitation, and show that it can also be used as a simple method to quickly define new bookmarks of interest, as well.

Figure 5:
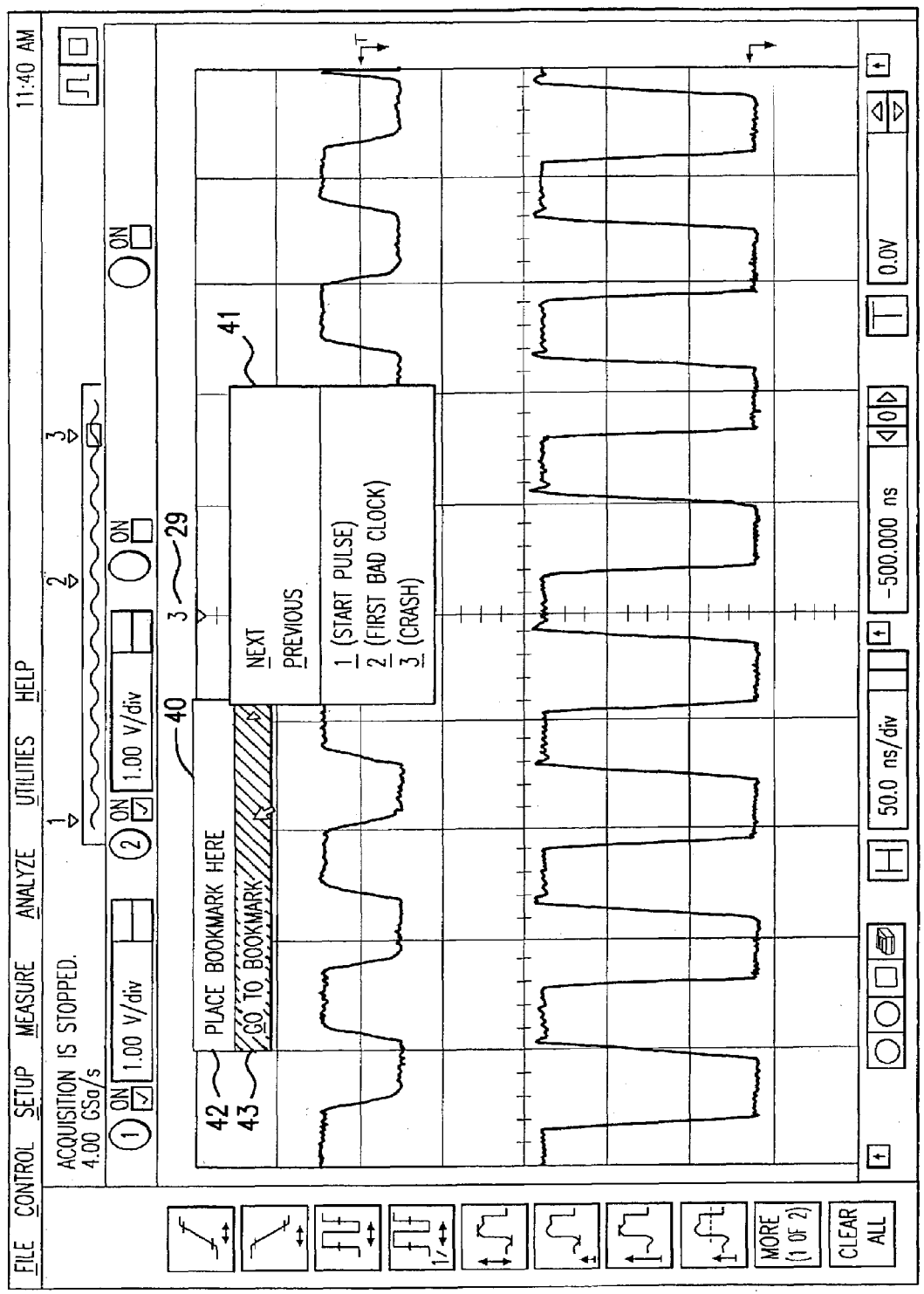
FIG. 5 illustrates another drop down menu useful in navigating between existing bookmarks and for initiating new bookmarks.

Refer now to FIG. 5 and note the presence of menus 40 and 41. Menu 40 appears in response to an alternate click (typically a right click on a right-handed pointing device or a left click on a left-handed device) done while the pointer is in the border region just above or below the waveform grid. Menu 40 offers two choices: "Place Bookmark Here" 42 and "Go To Bookmark" 43. Selecting choice "Place Bookmark Here" 42 creates a new bookmark, taking the first available bookmark name. The horizontal position of the mouse pointer (usually an arrow) is taken as the location within the present view to which the new bookmark is to refer; that horizontal position may later be translated left and right for fine adjustment. Selecting choice "Go To Bookmark" 43 produces sub-menu 41, whose choices include "Next", "Previous", and a list of defined bookmarks and their associated comments. In the preferred embodiment the list includes up to all eight bookmarks, if all should exist. That list might also be a partial list, owing to there being more defined bookmarks than menu 41 provides space for. If a destination bookmark is not present in the list, then a scrolling mechanism can be invoked (not shown), and an appropriate subset of the list will appear in the menu 41, which remains visible until one of the listed bookmarks is selected or the operator clicks with the mouse outside menu 41. Upon the selection of a listed bookmark the menus 40 and 41 are closed and the view associated with the chosen bookmark is displayed.

The Next and Previous choices cause ordered visitation to bookmarks along the entire acquisition, where Next means "to the right of the present center screen location", and Previous means "to the left of". This is not necessarily the same as going to the bookmark with the next higher or next lower numbered name. This is so, since even if bookmarks definitions are internally kept in a list ordered by name, their individual time values can be modified to represent an arbitrary ordering of locations along the acquisition as a whole.

Figure 6:
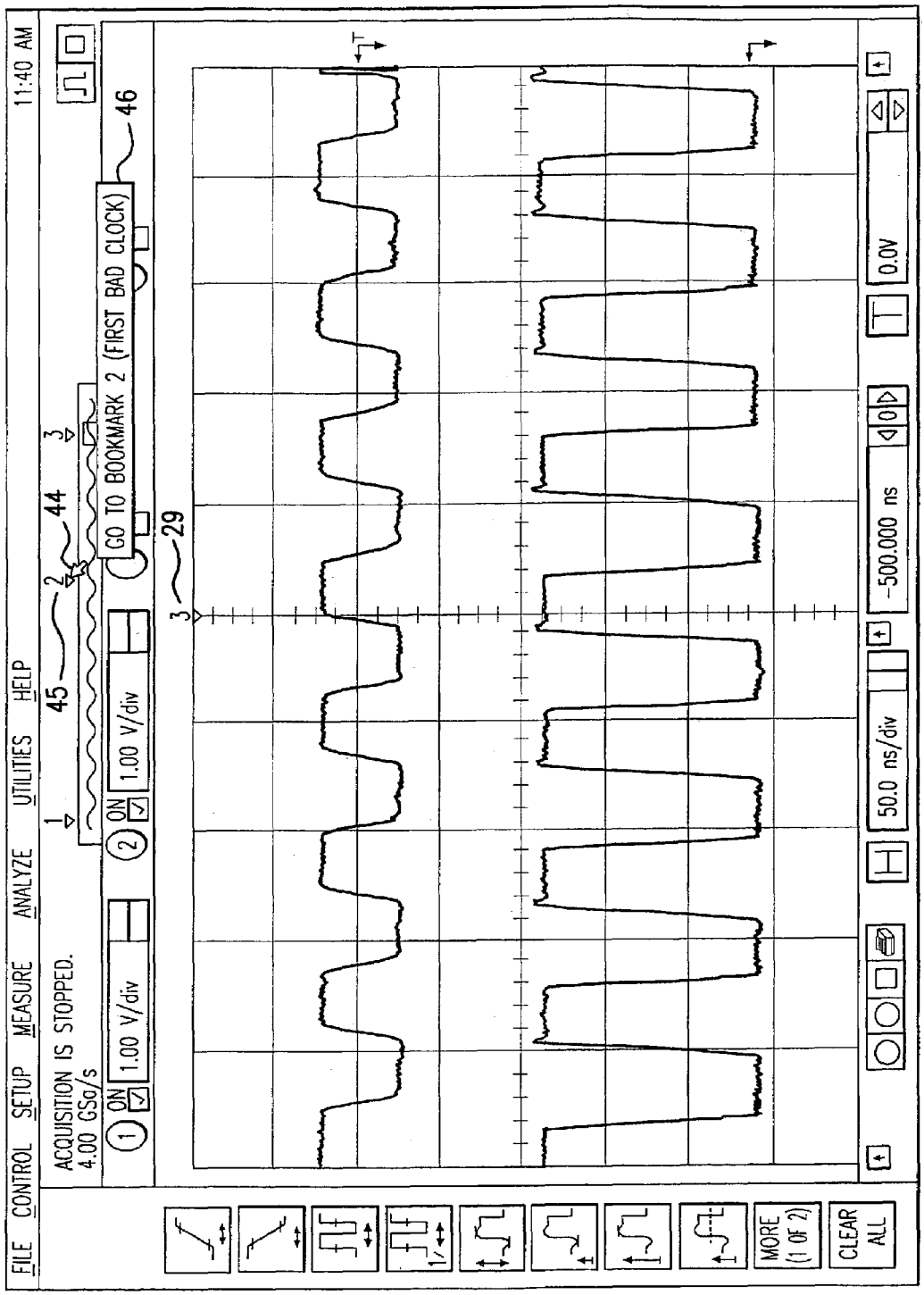
FIG. 6 illustrates a convenient and concise "point and click" method of navigating to an existing bookmark.
Figure 7:
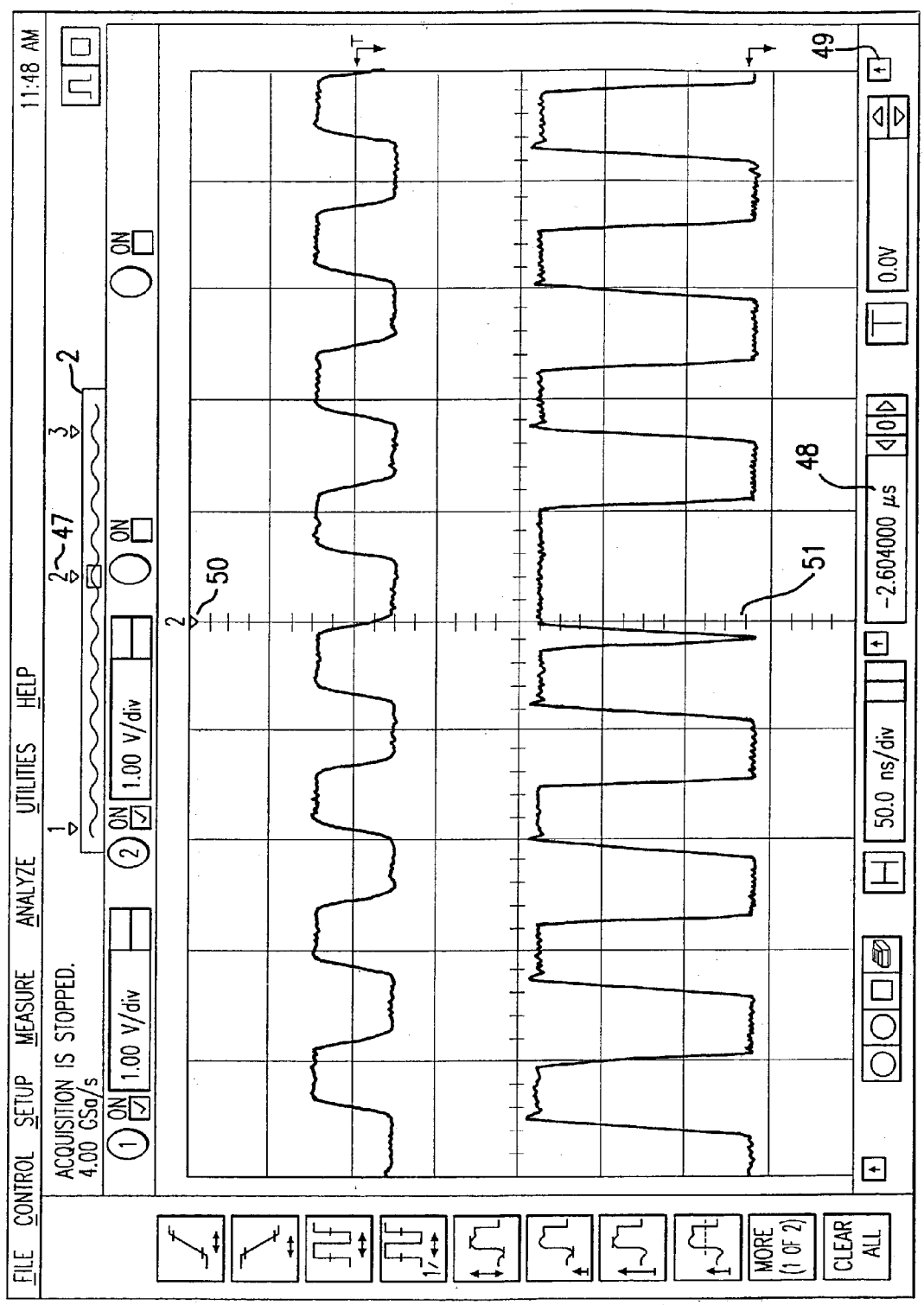
FIG. 7 illustrates the displayed result of an instance of using the method of FIG. 6 for the acquisition and bookmarks of FIG. 3.

There is an even easier way to display a given bookmark. Refer to FIG. 6, and note that the mouse pointer 44 is positioned over the annunciator 45 of bookmark #2. This state of affairs produces an information window 46 whose content "Go To Bookmark 2 (First bad clock)" reminds the operator of what bookmark #2 pertains to and that a jump to bookmark #2 will occur if he clicks the mouse. The result of clicking the mouse is shown in FIG. 7. Note that in the memory bar box 2 the small highlighted window is beneath the annunciator 47 for bookmark #2, indicating that the view on the screen below is that for bookmark #2. As further correlation, note that the delay value 48 is −2.604 usec, and that highlighted arrow 49 indicates that the right edge of the view possesses that value of delay. Since the horizontal time per division is shown as 50 nsec/div, and there are five divisions of separation between the labeled annunciator #2 (50) and the right edge of the screen, adding 250 nsec of delay to 2.604 gives a total of −2.854 usec for the center screen time. Referring momentarily back to FIG. 3, that is indeed the quantity shown in the Time Value field for bookmark #2. And, to end this part of the explanation, there at bookmark #2 is indeed a bad clock cycle 51, which in the hypothetical example is the likely cause of the glitch.

If, instead of clicking the mouse while its pointer was proximate labeled annunciator 47, the operator held the mouse button down and dragged annunciator 47 left or right, then the time value for bookmark #2 would be adjusted accordingly, with its adjusted value shown in a nearby small box.

Figure 8:
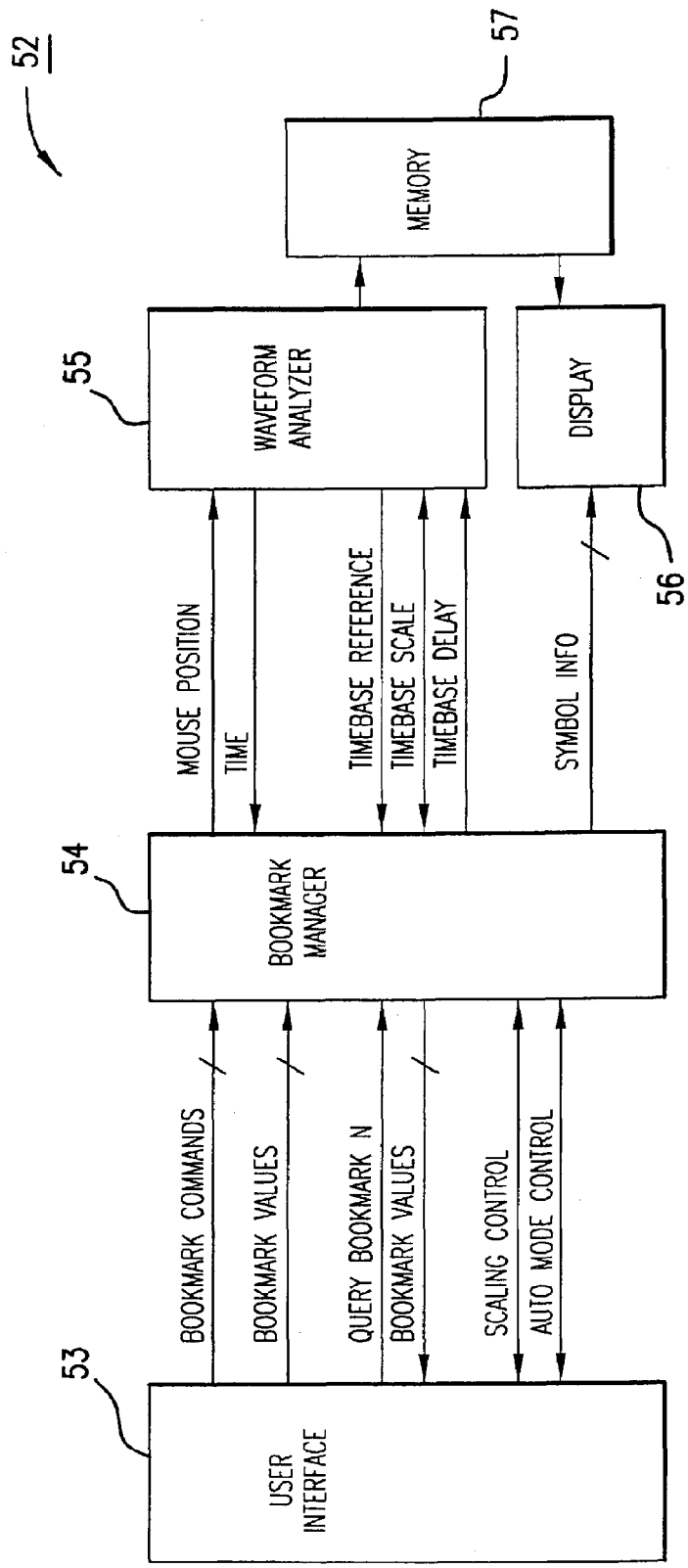
FIG. 8 is a software block diagram illustrating the general relationship between a bookmark manager and other major elements of an oscillographic instrument.

Simplified block diagrams and flowcharts may be used to more fully understand the implementation of various bookmark features. For example, if the oscillographic instrument were an HP 54800 series scope, then the block diagram of FIG. 8 is a preferred way of incorporating the bookmark features into that environment. Before turning to that figure, it should be noted that we are not suggesting that it is an overall block diagram of an entire scope suitable for explaining all aspects of oscillographic operation. It is instead a useful tool for understanding how bookmarks may be incorporated into one specific system.

Refer now to FIG. 8, which is a simplified software block diagram 52 illustrating the relationship between a user interface 53, bookmark manager 54, waveform analyzer 55, a display 56 and a memory 57. The bulk of the acquisition section of the scope (analog to digital converters, clocks and time base generator, etc.) are associated with waveform analyzer 55. It performs measurements in accordance with control settings (many of which are made via the user interface 53, which may be a GUI, or Graphical User Interface), and produces a result that includes, among other things, digital values stored in memory 57. The display 56 shows the view that is displayed on the screen. That view may be less than the entire acquisition, and may change as the operator pans and zooms. In any case it is the responsibility of the waveform analyzer to create the particular view that is to be seen on the screen. To that end it is responsive to the operation of the bookmark manager 54, which in turn receives information indicating bookmark control actions by the operator. For example, such a control action might be selecting an entry in a menu (a GUI case) or that a certain bookmark related button was pressed or knob turned (assuming dedicated front panel controls).

Accordingly, the user interface 53 provides bookmark command information, which includes: Define Here (use mouse pointer horizontal position, as in FIG. 5); Define Bookmark #N (the menu of FIG. 3); Go To Next/Previous (as in FIG. 5); Go To bookmark #N (various ways); and, clearing (deleting) a bookmark. The user interface also provides various bookmark values, which include: N (what bookmark # or name); a flag that the bookmark is currently defined; the Time Value (field 26 of FIG. 3); what icon to use to denote the bookmark in other presentations, such as the memory bar 2; scale (horizontal time per division to use); and, the associated comment text.

The bookmark manager 54 receives these inputs and interacts with the waveform analyzer to cause the specified view to be created in memory 57. As part of this process it adds symbol information that also appears in the displayed view, such as the value of N, the time, the icon and its color.

Figure 9:
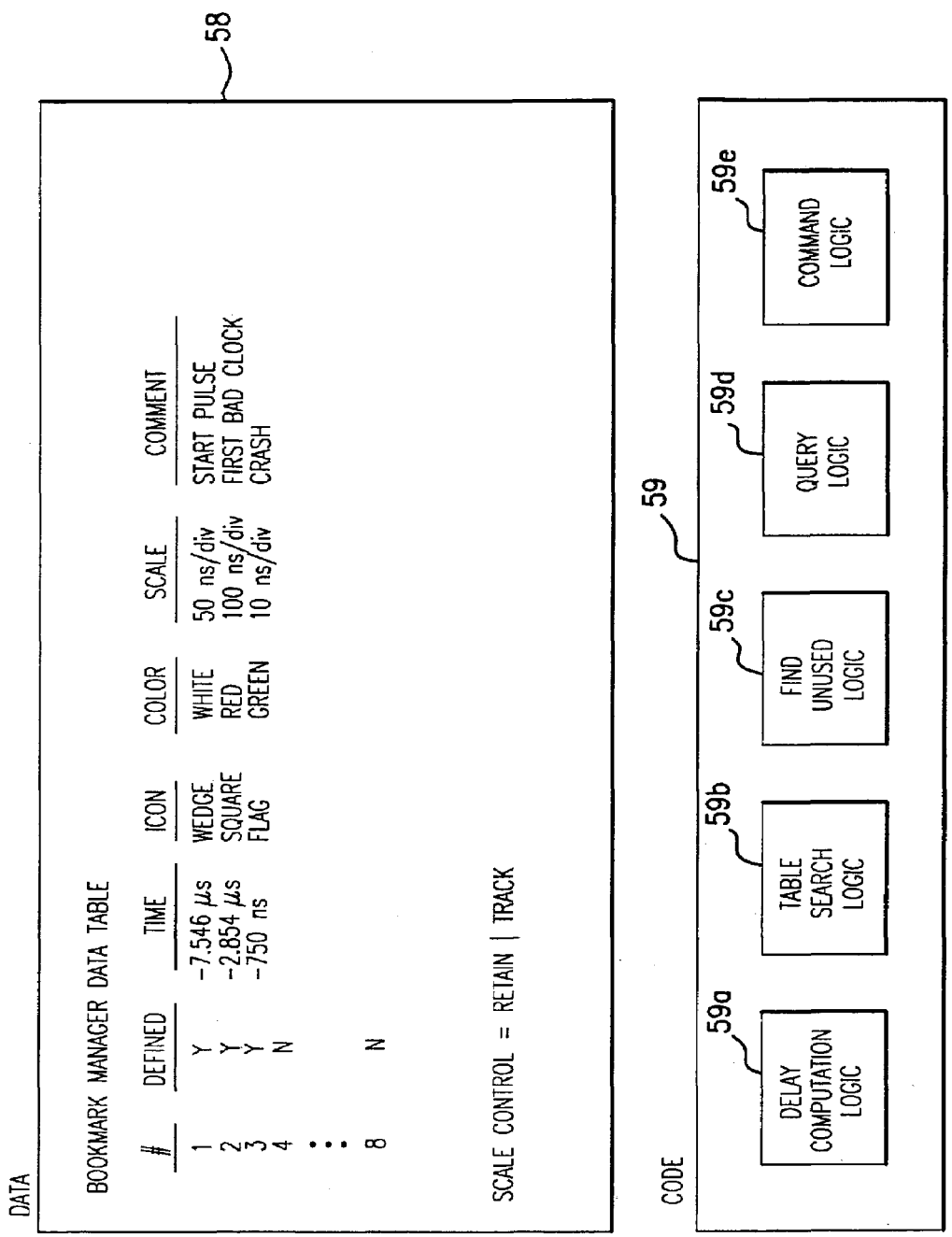
FIG. 9 is a software block diagram illustrating certain internal details of the bookmark manager of FIG. 8.

Refer now to FIG. 9, which illustrates two aspects of the internal nature of the bookmark manager 54. One aspect is that of a data structure 58, called the Bookmark Manager Data Table. It is essentially an eight (number of permitted bookmarks) by seven parameter array. These fifty-six items, plus two additional (global) flags, define all that is needed to pan, zoom and annotate the acquisition to create the view that is associated with the bookmark. The seven parameters per bookmark are: its number (#, or name); a flag indicating if that bookmark has been defined; the time; the color associated with the bookmark (so that its icon can be set to a useful color); the horizontal time scale (time/div) to use; and, the comment text. The two global flags affect all bookmarks. One of these is called "Scale Control", and is set as a result of selecting one of push buttons 31 and 32 in the Horizontal Scaling box 30 discussed in connection with FIG. 3. This flag tells, when returning to a bookmark, whether to use the horizontal time scale that was in use when the bookmark was defined, or to use the horizontal time scale already in use.

Another aspect of the bookmark manager 54 is code 59 that is executed to implement the various features that have been discussed. In general, this code is divided into five sections, 59a–e as shown. These five sections of code get used in various ways in the implementation of the flowcharts of FIGS. 10–14, to which we now turn.

Figure 10:
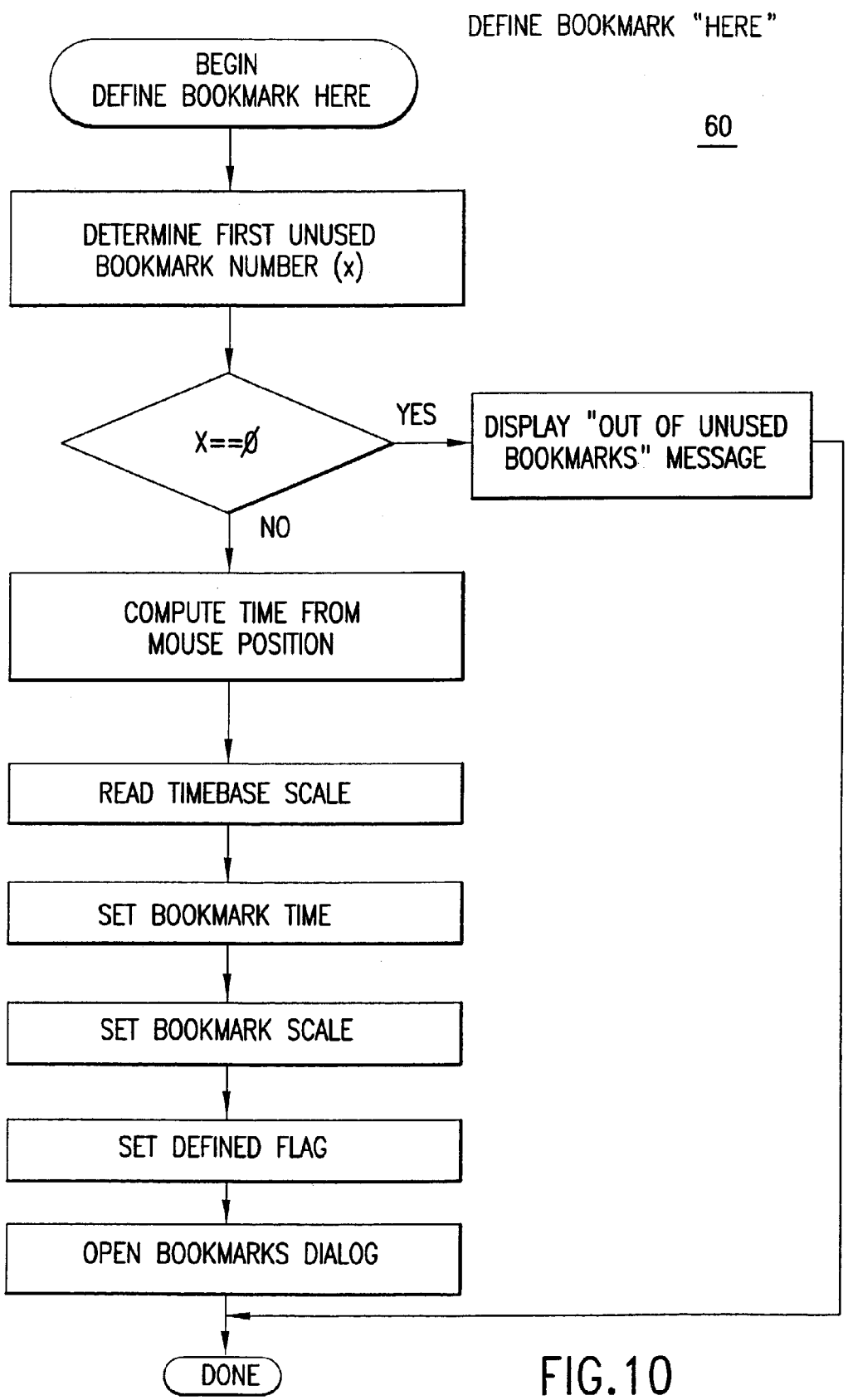
FIG. 10 is a flowchart illustrating the process of creating or defining a bookmark using the procedure described in connection with FIG. 5.

FIG. 10 is a simplified flowchart 60 that describes the process of creating or defining a bookmark using the procedure described in connection with FIG. 5, where the time value is taken from the horizontal position of the mouse pointer. If no bookmarks are available, a message is displayed to that effect. If bookmarks are available it selects/accepts for a bookmark, certain of the parameter values for the data table 58 shown in FIG. 9.

Figure 11:
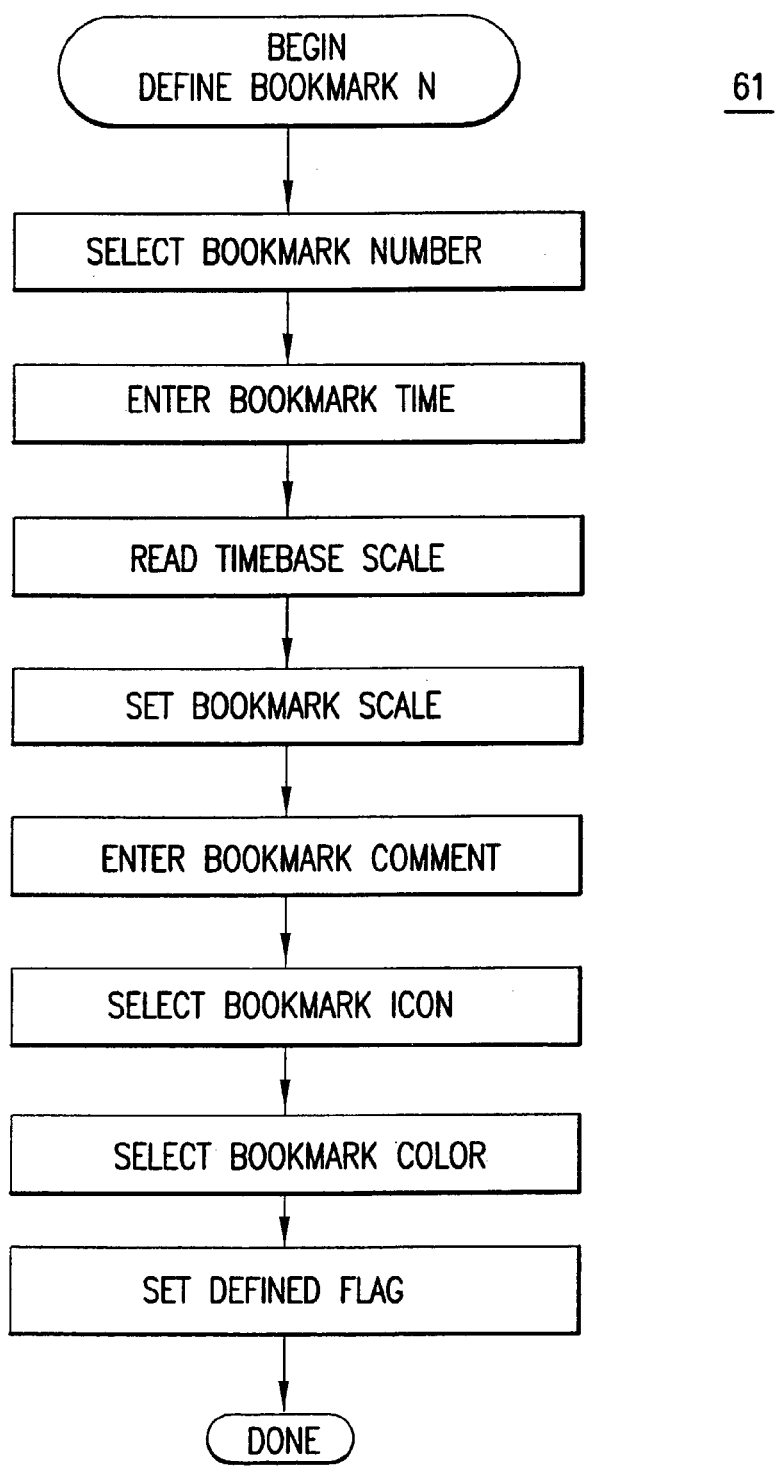
FIG. 11 is a flowchart illustrating the method of bookmark generation described in connection with FIG. 3.

FIG. 11 is a simplified flowchart that describes the process of bookmark definition performed in accordance with the method of FIG. 3. It, too, fills in parameter values for a bookmark entry in the data able 58. The difference between FIG. 10 and FIG. 11 reflects the different degrees of simplicity versus flexibility afforded the different methods of bookmark creation by the methods of FIGS. 5 and 3, respectively.

Figure 12:
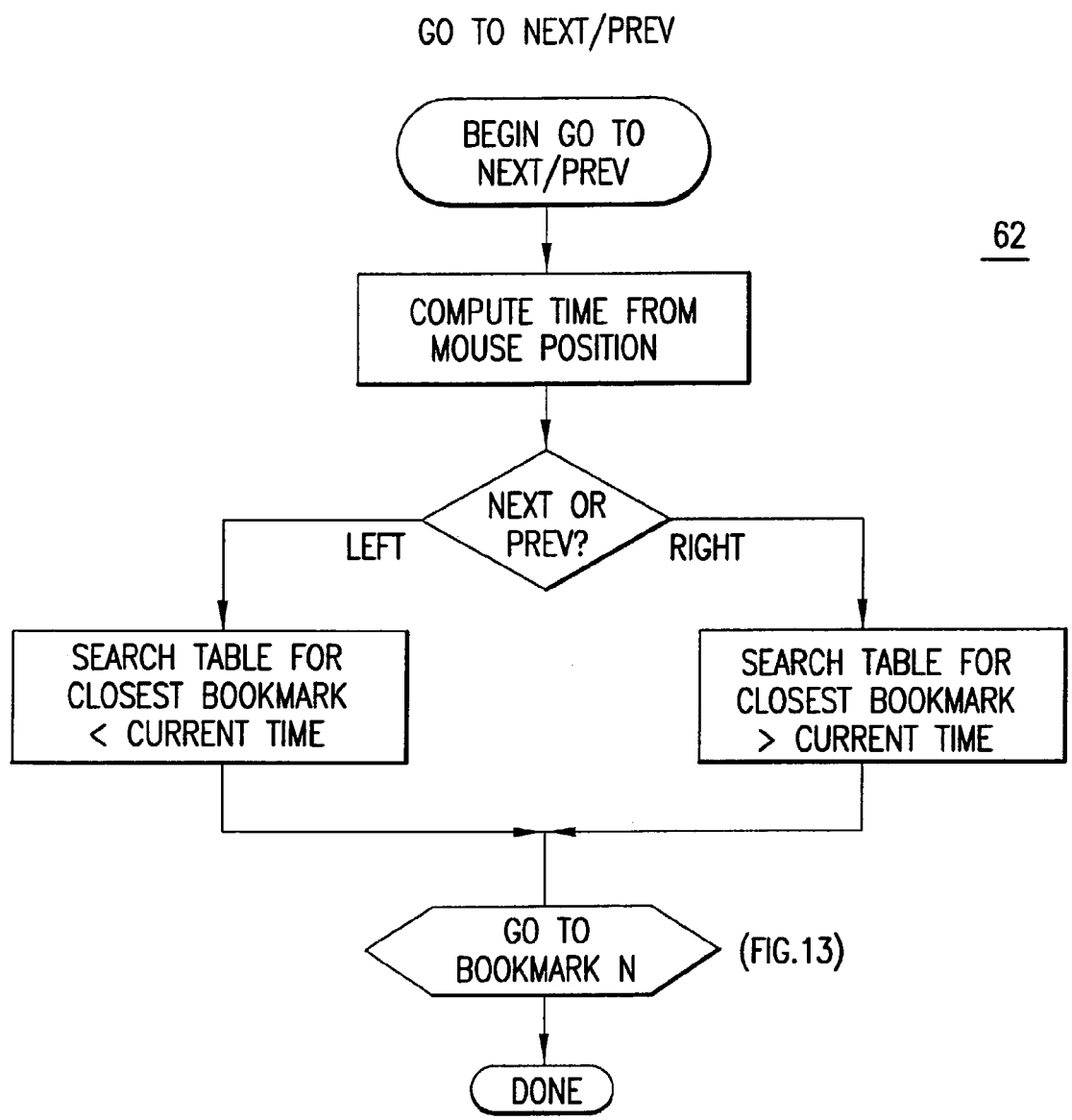
FIG. 12 is a flowchart illustrating internal operation in connection with the Next and Previous choices for bookmark navigation depicted in connection with FIG. 5.

FIG. 12 is a simplified flowchart describing the actions taken to go to a "NEXT" or "PREVIOUS" bookmark in a sequence of defined bookmarks. As mentioned earlier, the terms "NEXT" and "PREVIOUS" do not refer to any ordering in bookmark names, as that is not a reliable guide to the ordered progression of bookmark locations along the acquisition. That is, they refer to translation along the time axis, with "NEXT" being further to the right and "PREVIOUS" being further to the left. These directions of left and right are taken relative to the time value currently associated with the horizontal component of the mouse pointer within the current view. After that determination the flowchart 63 of FIG. 13 is used to go to that different bookmark.

Figure 13:
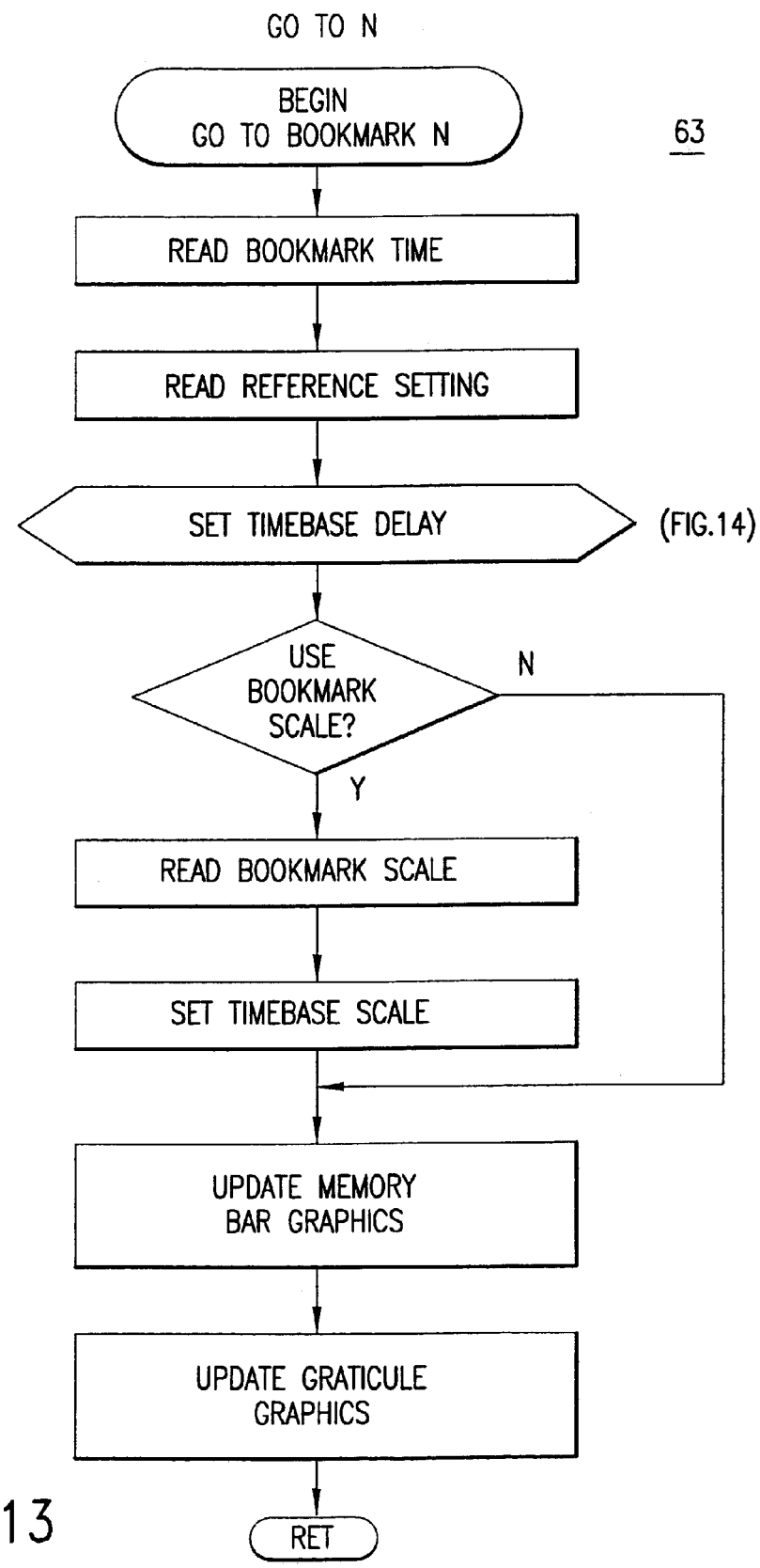
FIG. 13 is a flowchart illustrating the process of navigating to a named bookmark.
Figure 14:
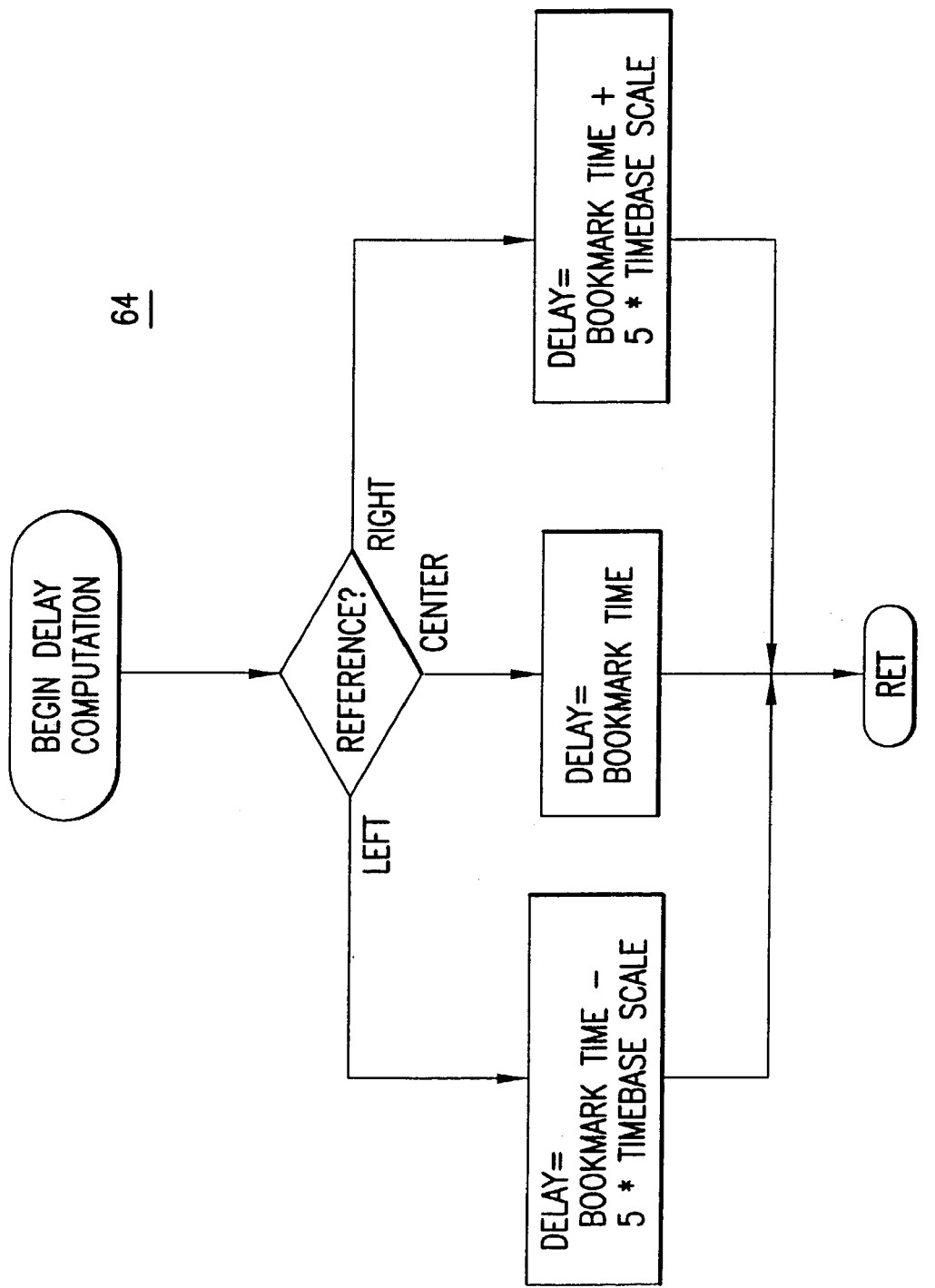
FIG. 14 is a flowchart illustrating how a reference location within the displayed view affects the process illustrated in FIG. 13.

FIG. 13 is a flowchart 63 that describes going to a named bookmark. That is, it causes the display to contain a view of the named bookmark. To do this it must take into account which of the left edge, right edge or center, of the screen is taken as the reference location for the delay value, as well as what the time base scale (horizontal time per division) is. This is accomplished by the flowchart 64 shown in FIG. 14. Once that is done, flowchart 63 of FIG. 13 continues to create the desired view in the manner indicated.

Finally, it will be appreciated that, while we have explained the notion of bookmarks in the context of a particular digital oscilloscope, it is applicable to other environments as well. Consider, for example, an arbitrary waveform generator capable of creating long irregular waveforms. Those instruments often have display mechanisms to allow the result to be depicted for evaluation and editing during development of a waveform. That display mechanism may need to produce views that are less than the entire waveform so that certain features may be seen with clarity. The notion of bookmarks as explained herein would be a valuable asset in such an environment.

We claim:

1. A method of identifying and recalling into an oscillographic display an arbitrary and operator selected portion of a waveform having digital values stored in a memory as an ordered sequence of values, the method comprising the steps of:
   (a) operator selection of an arbitrary waveform portion of interest by specifying a collection of parameters including values for horizontal position and horizontal scaling that determine which digital values are used to create waveform images in the display, the arbitrary waveform portion selected by the operator being less than the entire waveform;
   (b) associating an ordinal label with the collection of horizontal position and horizontal scaling parameters specified in step (a);
   (c) storing in a memory the association of the ordinal label of step (b) with the collection of horizontal position and horizontal scaling parameters specified in step (a);
   (d) subsequent to step (c), displaying a waveform image different from the arbitrary waveform portion of interest specified in step (a);
   (e) subsequent to steps (a)–(d), operator selection of an ordinal label from a menu showing at least one ordinal label that has been associated in step (b) and whose association was stored in step (c); and
   (f) in response to step (e), displaying the operator selected and arbitrary waveform portion specified by the collection of horizontal position and horizontal scaling parameters in step (a) and associated with the ordinal label of step (b) by re-invoking the values of the horizontal position and horizontal scaling parameters in the collection associated with the ordinal label chosen from the menu in step (e).

2. A method as in claim 1 wherein the collection of horizontal position and horizontal scaling parameters further includes a vertical scaling parameter.

3. A method as in claim 1 wherein steps (a)–(c) are repeated a plurality of times for a corresponding plurality of different operator selected arbitrarily waveform portions of interest, and wherein the menu of step (e) contains a different and unique ordinal label entry for each such waveform portion in the plurality of different operator selected arbitrarily waveform portions of interest.

4. A method as in claim 1 wherein step (b) includes associating a comment text with the ordinal label, step (c) includes storing the comment text, and step (e) further includes the step of displaying the comment text associated with an ordinal label that can be chosen from the menu.

5. A method as in claim 1 wherein the digital values are digitized values for an electronic signal and the memory in which they are stored is the memory of a digital oscilloscope.

6. A method as in claim 1 further comprising the step of displaying a symbolic representation of the entire waveform and including at a location thereon at least one labeled annunciator having the same ordinal label as in step (b), the location of the at least one labeled annunciator on the symbolic representation corresponding to the relative position along the entire waveform of the corresponding operator selected arbitrary waveform portion of interest.

7. A method as in claim 6 further comprising the step of implementing a GUI and step (e) comprises clicking with a mouse whose associated screen pointer has been positioned proximate a labeled annunciator.

8. A method as in claim 7 wherein the GUI displays a comment text associated with the labeled annunciator prior to the mouse click.

9. Waveform display apparatus comprising:
a memory containing ordered digital values representing the sequential values of a work signal of interest;
a user interface coupled to the memory and implementing commands from an operator of the apparatus and that determine what portion of the work signal's waveform is to be displayed;
a display coupled to the user interface and to the memory, the display creating in response to horizontal position and horizontal scaling parameters entered via the user interface, visible images of different arbitrarily and operator selected proper subsets of the ordered digital values;
a bookmark controller coupled to the user interface and to the display, the bookmark controller responsive to a command, entered via the user interface, to: (a) create a bookmark by recording in a bookmark table collections of the horizontal position and horizontal scaling parameters, those collections being respectively associated with the visible images of the different arbitrarily and operator selected proper subsets, and (b) associate a unique ordinal label with each created bookmark; and
the bookmark controller, in response to a command that references an ordinal label for a bookmark, that is entered via the user interface and that is a command to visit that referenced bookmark, causing the display to: (a) re-invoke the horizontal position and horizontal scaling parameters of the collection associated with the referenced bookmark to be visited, and (b) produce on the display the corresponding visible image of the arbitrarily and operator selected subset for that associated visited bookmark.

10. Apparatus as in claim 9 wherein the collection of parameters recorded and re-invoked by the bookmark controller further includes a vertical scaling parameter.

11. Apparatus as in claim 9 wherein the user interface further comprises a GUI implemented by program code executed by a microprocessor coupled to a program memory.

12. Apparatus as in claim 11 wherein the user interface includes a symbolic waveform symbol whose extent in one dimension represents the entirety of the sequential values in the memory, each bookmark created by the bookmark controller is represented by a corresponding icon that includes the associated unique ordinal label for that bookmark, and the icon for a bookmark is displayed proximate the symbolic waveform symbol in a location corresponding to where a visible image for that bookmark would be located in the sequential values.

13. Apparatus as in claim 12 wherein the icon is annotated to denote the value of a parameter associated with the corresponding bookmark.

14. Apparatus is in claim 9 wherein bookmarks are represented by associated icons displayed proximate locations along a waveform trace created by the display from the ordered digital values in the memory, which locations correspond to the positions therein of the visible images created by visiting those bookmarks.

15. Apparatus as in claim 9 wherein a comment is in included among the parameters for a bookmark recorded in the bookmark table.

16. Apparatus as in claim 9 wherein bookmarks are represented by icons of selectable shape and the parameters recorded in the bookmark table include an indication of an icon's selected shape.

17. Apparatus as in claim 12 further comprising a mouse and wherein the bookmark controller causes a visit to a bookmark in response to a mouse click over an icon corresponding to that bookmark.

18. Apparatus as in claim 14 further comprising a mouse and wherein the bookmark controller causes a visit to a bookmark in response to a mouse click over an icon corresponding to that bookmark.

19. Apparatus as in claim 12 further comprising a mouse and wherein the bookmark controller causes the horizontal position of a bookmark to change in response to dragging its associated icon with the mouse.

20. Apparatus as in claim 14 further comprising a mouse and wherein the bookmark controller causes the horizontal position of a bookmark to change in response to dragging its associated icon with the mouse.

21. Apparatus as in claim 9 wherein a command to visit a bookmark leaves an existing horizontal scaling in effect by preventing the re-invocation of the horizontal scaling recorded in the bookmark table for that bookmark to be visited.

22. Apparatus as in claim 9 wherein the waveform display apparatus comprises a digital oscilloscope.

* * * * *

UNITED STATES PATENT AND TRADEMARK OFFICE
CERTIFICATE OF CORRECTION

PATENT NO. : 6,958,754 B2 Page 1 of 1
APPLICATION NO. : 10/388352
DATED : October 25, 2005
INVENTOR(S) : Alexander et al.

It is certified that error appears in the above-identified patent and that said Letters Patent is hereby corrected as shown below:

In column 12, line 15, in Claim 15, after "comment is" delete "in".

Signed and Sealed this

Twenty-first Day of November, 2006

JON W. DUDAS
*Director of the United States Patent and Trademark Office*